Feb. 7, 1967 H. M. HOOGENDOORN ET AL 3,303,399

GLASSES FOR ENCAPSULATING SEMICONDUCTOR DEVICES
AND RESULTANT DEVICES

Filed Jan. 30, 1964

INVENTORS
HELEN M. HOOGENDOORN
SEYMOUR MERRIN
BY
Everett A. Gastrell
ATTORNEY

United States Patent Office 3,303,399
Patented Feb. 7, 1967

3,303,399

GLASSES FOR ENCAPSULATING SEMICONDUCTOR DEVICES AND RESULTANT DEVICES

Helen M. Hoogendoorn, Poughkeepsie, and Seymour Merrin, Wappingers Falls, N.Y., assignors to International Business Machines Corporation, New York, N.Y., a corporation of New York Filed Jan. 30, 1964, Ser. No. 341,212
4 Claims. (Cl. 317—234)

The present invention is directed to glasses for encapsulating semiconductor devices and to semiconductor devices which are at least partially encompassed by a layer of such glasses. More particularly, the invention relates to glasses for covering the critical surface or surfaces of silicon semiconductor devices.

Semiconductor diodes and transistors for use in various applications such as in computers are made to exacting specifications to assure desired electrical characteristics and to provide precise performance. To retain those characteristics, it is necessary to protect the surfaces about the exposed junctions from conditions which would impair their characteristics or would otherwise damage or destroy the devices. Surface contaminants, moisture and harmful vapors giving rise to chemical attack are detrimental to the proper operation of semiconductor devices. For several years intense efforts have been expended with germanium and silicon devices, especially the latter, to combat those contaminants by physically or chemically passivating the exposed surfaces of the devices. Those efforts have included the formation of oxides on the surface of the devices or oxides in conjunction with surface treatments to effect an esterification of silanol groups on the device surfaces. Also, physical treatments of those devices have involved encapsulating them in various plastics or combinations of oxides and plastics. Other encapsulating media have included low melting point glasses such as those found in the arsenic-sulphur system and have also included high lead-silicate glasses.

While the various techniques mentioned above have been moderately successful in protecting PN junctions for some purposes, they have not proved to be as effective as may be desired for many applications. More particularly, the encapsulating procedures have not afforded adequate or prolonged junction protection in some environments or have resulted in protective jackets that are too bulky for microminiaturization purposes.

Heretofore it has been determined that when a thin adherent silicon dioxide film is produced over the exposed PN junction or junctions of a semiconductor device, that junction is passivated and becomes fully protected from the action of junction-impairing contaminants when a thin impervious coating of glass is chemically bonded to the silicon dioxide film. Semiconductor devices with protected PN junctions and the techniques for protecting them with silicon dioxide films and glass coatings chemically bonded thereover are disclosed and claimed in the U.S. Patent 3,247,428 of John A. Perri and Jacob Riseman, Serial No. 141,669, entitled, "Coated Objects and Methods of Providing Protective Coverings Therefor," and the U.S. Patent 3,212,921 of William A. Pliskin and Ernest E. Conrad, Serial No. 141,668, entitled, "Method of Forming a Glass Film on an Object and the Product Produced Thereby," both patents having been filed September 29, 1961, and assigned to the same assignee as the present invention. The glasses of the present invention are useful for application to semiconductor devices such as those made of silicon by way of an intervening buffer layer of silicon dioxide using the techniques explained in the copending applications just mentioned. The temperature employed for applying these glasses to a semiconductor device is desirably low, being in the range of 540–560° C. Such application temperatures do not detrimentally affect the electrical characteristics of silicon semiconductor devices. Furthermore, when aluminum ohmic contacts are made to N-type silicon, undesirable rectifying contacts do not result since the range of glass application temperatures just mentioned is below the silicon-aluminum eutectic temperature of 577° C.

For some applications, it appears desirable to apply a glass coating directly and without an intervening buffer layer to a semiconductor device. This would avoid various fabrication steps described in the above-identified patents such as growing or depositing a silicon dioxide or other suitable layer on the semiconductor device prior to the application of the thin glass layer. Prior to applicants' invention, a glass which was not only capable of passivating the surface of a semiconductor device containing a junction coming to that surface but also possessing adequate chemical stability was not available.

It is an object of the invention, therefore, to provide a new and improved glass for encapsulating a semiconductor device.

It is another object of the invention to provide a new and improved glass having good chemical stability and which may be applied directly to the surface of a semiconductor device containing a junction for passivating that surface and protecting the junction from an adverse environment that otherwise might damage the junction and impair the electrical characteristics of the device.

It is a further object of the invention to provide a new and improved glass which has good resistance to chemical attack and may be applied directly to a semiconductor device without the need for an intervening buffer or passivating layer of a material such as a metal oxide.

It is an additional object of the invention to provide for bonding to a silicon semiconductor device a new and improved glass having a low application temperature and a thermal coefficient of expansion which is compatible with that of silicon.

It is yet another object of the invention to provide a new and improved semiconductor device which has a passivating glass jacket directly applied to a surface thereof.

In accordance with the particular form of the invention, an encapsulated semiconductor device comprising a semiconductor member having at least one PN junction therein; and a layer of glass encapsulating a surface of the semiconductor member having an application temperature below 570° C., the glass consists essentially of in mol percent lead oxide (PbO) 23–50, aluminum trioxide ($Al_2O_3$)0–19, boron trioxide ($B_2O_3$)6–18, silicon dioxide ($SiO_2$)33–65 and 0.1–1.0 mol percent of an oxide from the group consisting of niobium pentoxide ($Nb_2O_5$), zirconium dioxide ($ZrO_2$), titanium dioxide ($TiO_2$) and tantalum pentoxide ($Ta_2O_5$).

Also in accordance with the invention, a semiconductor device comprises a semiconductor member including a PN junction having a portion which comes to a surface of that member, and a layer of glass directly covering the junction and bonded directly to the surface and having the composition consisting essentially in mol percent lead oxide 23–50, aluminum trioxide 0–19, boron trioxide 6–18, silicon dioxide 33–65 and 0.1–1.0 mol percent of an oxide from the group consisting of niobium pentoxide, zirconium dioxide, titanium dioxide and tantalum pentoxide.

The foregoing and other objects, features and advantages of the invention will be apparent from the following more particular description of preferred embodiments of the invention, as illustrated in the accompanying drawing.

Figure 3:
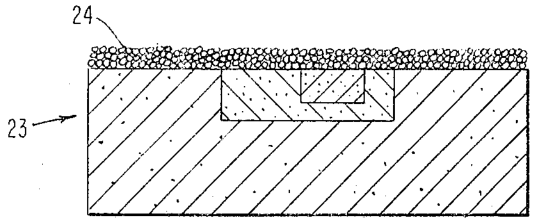
Figure 4:
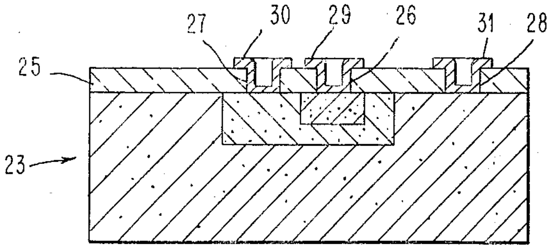

FIG. 3 is an enlarged sectional view of a semiconductor device having a thin film of glass particles applied directly to a surface of the device which contains exposed PN junctions; and FIG. 4 is a similar view of a completed semiconductor device in accordance with one form of the present invention having a thin hole-free glass layer bonded directly to the surface of the device containing exposed PN junctions.

Figure 1A:
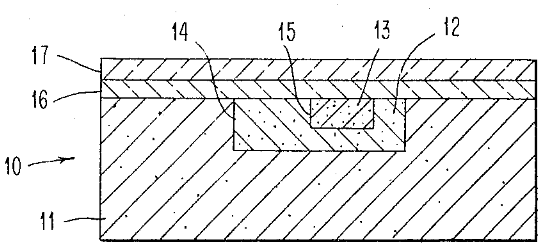
FIGS. 1A and 1B are enlarged sectional views of a semiconductor device which has a glass layer chemically bonded to an oxide layer formed on the surface of the device which contains PN junctions having portions that come to the surface.
Figure 1B:
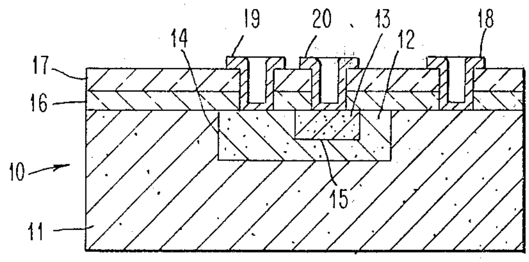

*Encapsulation of FIGS. 1A–1B semiconductor device*

Referring now more particularly to FIG. 1A of the drawing, there is represented a semiconductor device 10, such as one of the planar type, comprising a starting wafer 11 of a semiconductor material such as silicon which serves as the collector region and has base and emitter regions 12 and 13, respectively, formed therein by well-known diffusion procedures. Those operations create PN junctions 14 and 15 having portions which come to the upper surface of the device. Because of the presence of the exposed junctions, the upper semiconductor surface constitutes the critical device surface which must be suitably passivated in order to retain the desired electrical characteristics of the device and to protect it from moisture, harmful vapors and other surface contaminants. This may be accomplished in the manner explained in detail in the above-identified patent of John A. Perri and Jacob Riseman by applying to the critical surface and junctions a pair of films or layers comprising a continuous oxide layer 16 of a material such as silicon oxide and a glass layer 17 which is chemically bonded to the layer 16.

Briefly considered, layer 16 may be a genetic layer formed on a critical surface of the parent silicon body comprising the starting wafer 11 and the diffused regions 12 and 13 by means other than exposing it to the atmosphere. Heating the body to a temperature between 900 and 1400° C. in an oxidizing atmosphere of air saturated with water vapor or in an atmosphere of steam in the manner disclosed in Patent 2,802,760 to Derick et al. produces an uninterrupted silicon oxide layer 16 wherein silicon dioxide is believed to be the major constituent thereof. Alternatively, the layer may be produced by a conventional electrochemical treatment or by thermal decomposition of a siloxane compound in the manner disclosed in Patent 3,089,793 to Jordan et al. Layer 16 may have a thickness in the range of 1,000–30,000 angstroms, 5,000–6,000 angstroms being a very effective range. Thereafter a glass film or layer 17 is applied to the silicon dioxide layer 16 by any of several well-known techniques such as spraying, settling or silk screening a thin coating of finely divided glass particles followed by a firing process which fuses the particles and forms a continuous hole-free glass layer that is chemically bonded to the underlying layer 16. Glass layers which include glass compositions of the present invention and have thicknesses in the range of 20,000–50,000 angstroms are attractive over oxidized silicon devices, and are particularly effective when applied by the technique disclosed and claimed in the above identified patent of William A. Pliskin and Ernest E. Conrad.

Briefly, the method disclosed in that patent comprises centrifuging the structure of FIG. 1A with its silicon dioxide layer 16 thereon, but minus the glass layer 17, in an organic fluid having a dielectric constant in the range of about 3.4–20.7 and containing a colloidal suspension of finely divided glass particles to deposit such a coating of particles on layer 16. Thereafter the structure is removed from the fluid, and then heated near the softening temperature of the glass particles for a time sufficient to fuse those particles to the silicon dioxide film, thereby producing the thin uniform hole-free glass layer 17 of FIG. 1A over the upper surface of the device. Suspending media for the glass particles may include organic fluids such as benzine, hexane, petroleum ether, methyl acetate, ethyl acetate, tertiary butyl alcohol mixed with a small amount of secondary butyl alcohol to maintain the former fluid at room temperature, isopropyl alcohol, acetone, methyl alcohol, dimethyl formamide and various mixtures of those fluids. Excellent results with this centrifuging and fusing technique have been obtained when the selected suspending medium for the glass particles has a dielectric constant within the range of 6–12 and the mean particle size of the comminuted glass is about 0.1–0.7 micron. A mixture of 10 parts of isopropyl alcohol and 90 parts of ethyl acetate has proved to be a very desirable suspending fluid. A centrifugal force of from 1,000–2,500 times the force of gravity in conjunction with a 1–2 minute centrifuging operation has proved to be useful in depositing glass having a particle size in the range under consideration. The fusing operation may be conducted for about 2–5 minutes at a suitable temperature in the range of from 500–950° C., the temperature depending upon the type of glass selected to serve as the comminuted glass in the suspending fluid. The duration of the fusing operation in the temperature range just mentioned is such that the device under consideration is capable of withstanding the fusing temperature.

In order that the resultant semiconductor device may operate satisfactorily over a wide range of temperatures without the creation of undesirable cracks in the glass which might impair the effectiveness of the hermetic glass seal, it is desirable to select a glass having a thermal coefficient of expansion which is compatible with that of silicon. The various characteristics of glass and the semiconductor device fabrication procedures are such that it is usually not possible to employ a glass having a coefficient of expansion which substantially matches that of the semiconductor device. However, glasses with considerably different coefficients of expansion may be employed using the centrifuging glass technique described above, the glasses used depending to some extent on the thickness of the glass layer which is laid down and the temperature range which the device may encounter during operation. In general, when thin glass layers are employed as protective glasses in the environment under consideration, it is possible to have a greater mismatch in expansion coefficients between the semiconductor substrate and the glass than can be tolerated with thicker glass layers without subjecting those layers to a harmful cracking. For example, Pemco 1117 glass films (which do not have a composition in accordance with the glasses of the present invention) up to 90,000 angstroms thick having an expansion coefficient of $64 \times 10^{-7}$ per degree C. have been successfully applied to silicon substrates as described above using centrifuging and fusing techniques of the above-identified patent of Pliskin and Conrad without encountering cracking.

Despite meticulous steps to prevent their presence, surface contaminants develop about those portions of the junctions 14 and 15 which emerge at the upper surface of the semiconductor device. The inert silicon dioxide layer 16 passivates the junction portions and the semiconductor surface thereabout. Since the layer 16 is genetically derived from the parent silicon body, it is intimately bonded thereto and effectively is an integral part thereof. Chemically resistant glasses such as borosilicate glass have proved to be particularly attractive for use in forming the layer 17. Unfortunately, the compositions of prior art glasses are such that when glass is applied directly to the surface of a semiconductor device containing an exposed junction or junctions, some of the glass components create surface states about the junctions or migrate into the semiconductor material and contaminate it and the junctions to an extent which may seriously impair the electrical characteristics of the device. For example, a borosilicate glass contains boron oxide and, when such a glass is applied directly to silicon, the conductivity-directing impurity boron is released and impairs the surface of the semiconductor device, the quality of its PN junctions and the electrical characteristics of the device. However, when a silicon dioxide layer 16 is employed intermediate the borosilicate glass layer 17 and the semiconductor material as represented in FIG. 1A, the fusing of the glass to the silicon dioxide is believed to cause the former to react chemically with the upper surface of the silicon dioxide and form a continuous glass region having a reduced boron oxide content. The under portion of the silicon dioxide layer (i.e., the portion adjoining the silicon starting wafer) does not react chemically with the glass layer which, during this fusing operation, is at an application temperature that is near the softening temperature of the glass particles. Accordingly, the silicon dioxide layer 16, because of the buffering action of its inner portion thereof, serves as a barrier layer or protective element which prevents harmful components such as the P-type impurity boron in the glass from penetrating the critical surface of the silicon semiconductor device containing the PN junctions, interacting therewith, and impairing the precisely established electrical characteristics thereof.

The fusing period is sufficiently short and the application temperatures of the glass layer 17 are sufficiently low in relation to a temperature which would adversely affect the device that the fusing period and temperature are compatible with the technology employed in making the semiconductor device. When the glass film cools to room temperature, it is integrally bonded with the silicon dioxide layer which in turn is intimately united with the silcon body. Thus there effectively exists over the silicon body, with its PN junctions coming to the surface of that body, a very thin composite protective layer which is chemically bonded to and integrally united with the surface of the body, is hole-free and impervious to external agents which might impair the electrical qualities of the semiconductor device, and affords the desired thermal and chemical properties of a good protective jacket.

Before the semiconductor device under consideration may be connected in circuit, it is necessary that it be supplied with suitable terminals. This is accomplished by etching holes through the glass and silicon dioxide layers 16 and 17 so as to expose portions of the surface of the semiconductor regions 11, 12 and 13, as represented in FIG. 1B, and then applying ohmic contacts 18, 19 and 20 thereto by the evaporation of a metal. A suitable acid such as hydrofluoric acid may be employed to perform the etching operation, which is accomplished through holes in a conventional etching mask that is placed on the glass film 17 and is properly oriented with respect to the semiconductor regions 11, 12 and 13. The size of the apertures in the mask, together with the etching times and the concentration of the etching solution, are selected so that the silicon dioxide layer 16 and some of the glass layer 17 span portions of the junctions 14 and 15 which extend to the surface of the semi-conductor body, as represented in FIG. 1B. In that way the junctions are protected with a coating of inert material.

*Description of new glass compositions*

Glasses of the present invention may be applied without an intervening silicon dioxide buffer layer to the critical surface of a semiconductor device or may be chemically bonded to a silicon dioxide layer in the manner explained above in connection with FIGS. 1A and 1B. The coefficient of expansion of such glasses is about $62\times10^{-7}$ or less, which makes them compatible with a silicon semiconductor device which may or may not have a silicon dioxide covering its surface. Furthermore, those glasses have application temperatures which are low, being below 570° C., so that the device characteristics are not impaired thereby. Furthermore, the P-type material aluminum may be employed in making ohmic contacts 18 and 20 by application to, as by evaporation, the semiconductor regions 11 and 13 even though those regions may be of N-type silicon. This is because the application temperature of the glass layer over the silicon dioxide layer is below the 577° C. silicon-aluminum eutectic temperature so that an unwanted rectifying contact does not result. A most attractive feature of the glass compositions of the present invention is that they may be applied directly to the semiconductor device surfaces containing the exposed PN junctions. This feature will be considered after having examined the inventive glass compositions.

A glass in accordance with the invention which has been found to be suitable for at least partially covering electrical circuit elements such as semiconductor devices and which is compatible with the semiconductor material thereof and has an application temperature below 570° consists essentially of 23–50 mol percent lead oxide (PbO), 0–19 mol percent aluminum trioxide ($Al_2O_3$), 6–18 mol percent boron trioxide ($B_2O_3$), 33–65 mol percent silicon dioxide ($SiO_2$), and 0.1–1.0 mol percent of an oxide additive from the group consisting of niobium pentoxide ($Nb_2O_5$), zirconium dioxide ($ZrO_2$), titanium dioxide ($TiO_2$), and tantalum pentoxide ($Ta_2O_5$). The oxide additive imparts chemical stability to the device. This glass is particularly attractive for encapsulating silicon semiconductor devices either directly or over a silicon dioxide layer. Its thermal coefficient of linear expansion is about $62\times10^{-27}$, although it may vary from about $50–70\times10^{-7}$, depending upon the composition of the particular glass selected. In general, a higher percentage of silicon dioxide in the glass imparts a higher application temperature. Expressed somewhat differently, the new and improved glass just mentioned may be said to comprise materials from a quaternary system $PbO-Al_2O_3-B_2O_3-SiO_2$ encompassed within the compositional tetrahedron of those four materials defined by straight lines joining the following compositional points expressed in mol percent:

| Points | PbO | $Al_2O_3$ | $B_2O_3$ | $SiO_2$ |
|---|---|---|---|---|
| 1 | 38.5 | 0 | 6 | 55.5 |
| 2 | 32.9 | 0 | 6 | 61.1 |
| 3 | 40.4 | 16.0 | 6 | 37.6 |
| 4 | 46.1 | 10.3 | 6 | 37.6 |
| 5 | 33.6 | 0 | 18 | 48.4 |
| 6 | 23.0 | 0 | 18 | 59.0 |
| 7 | 32.0 | 17.2 | 18 | 32.8 |
| 8 | 39.7 | 9.8 | 18 | 32.8 |

and 0.1–1.0 mol percent of an oxide from the group consisting of $Nb_2O_5$, $ZrO_2$, $TiO_2$ and $Ta_2O_5$. The glass exhibits good chemical stability, that is it has good resistance to chemical attack. When applied directly to silicon, the glass serves not only as a passivating agent or medium but also as a protective jacket which preserves the electrical and physical qualities of the semiconductor device. Various acid washes such as those which may be employed in connection with the fabrication of leads do not damage the protective jacket as by crazing or pitting that jacket or otherwise injuring the device and its characteristics. Also, moisture and noxious atmospheres encountered during operation of the device in its intended environment do not injure the glass or the sensitive junctions thereunder.

Another glass composition which has a smaller range of the materials identified in the preceding paragraph consists essentially of in mol percent 32–42 PbO, 0–19 $Al_2O_3$, 9–15 $B_2O_3$, 40–63 $SiO_2$ and 0.1–1.0 of an oxide from the group consisting essentially of $Nb_2O_5$, $ZrO_2$, $TiO_2$, and $Ta_2O_5$. A further glass also found to be useful for encapsulating purposes consists of in mol percent 30–50 PbO, 3–11 $Al_2O_3$, 9–15 $B_2O_3$, 40–65 $SiO_2$ and 0.5–0.85 of an oxide from the group consisting of $Nb_2O_5$, $ZrO_2$, $TiO_2$ and $Ta_2O_5$. Yet another glass consists essentially of in mol percent 27–32 PbO, 3.5–4.2 $Al_2O_3$, 9–15 $B_2O_3$, 52–53 $SiO_2$ and 0.5–0.85 of an oxide from the group consisting of $Nb_2O_5$, $ZrO_2$, $TiO_2$ and $Ta_2O_5$. Still another type glass of the type under consideration consists essentially in mol percent 27.8–31.7 PbO, 3.5–4.2 $Al_2O_3$, 12–15 $B_2O_3$, 52.3–52.8 $SiO_2$ and 0.5–0.7 of an oxide from the group consisting of $Nb_2O_5$, $ZrO_2$, $TiO_2$ and $Ta_2O_5$.

It has been found that glasses which exhibit better chemical stability employ niobium pentoxide as an oxide additive. A glass having high chemical stability, a coefficient of expansion about $57\times10^{-7}$ and an application temperature in the range of about 540–548° C. consists essentially of in mol percent PbO 31.7, $Al_2O_3$ 3.5, $B_2O_5$ 12.0, $SiO_2$ 52.8 and 0.5 of $Nb_2O_5$. It is not understood why the additive niobium pentoxide imparts better chemical stability than the other additives. Another stable glass which has a thermal coefficient of about $62\times10^{-7}$ and an application temperature of below 570° C. consists essentially of in mol percent PbO 32.5, $Al_2O_3$ 3.6, $B_2O_3$ 9.0, $SiO_2$ 54.1 and 0.8 of $Nb_2O_5$. Yet another glass having high chemical stability, a coefficient of expansion of about $57\times10^{-7}$ and an application temperature in the range of about 545–555° C. consists essentially of in mol percent PbO 27.9, $Al_2O_3$ 4.2, $B_2O_3$ 15.0, $SiO_2$ 52.4 and 0.5 of $Nb_2O_5$.

Another glass of the type under consideration and having a thermal coefficient of expansion of about $58\times10^{-7}$ and an application temperature in the range of about 545–555° C. consists essentially of in mol percent PbO 27.8, $Al_2O_3$ 4.2, $B_2O_3$ 15.0, $SiO_2$ 52.3 and 0.7 of $ZrO_2$. An additional glass which is compatible with silicon and has a coefficient of expansion of about $57\times10^{-7}$ and an application temperature in the range of about 545–555° C. consists essentially of in mol percent PbO 27.8, $Al_2O_3$ 4.2, $B_2O_3$ 15.0, $SiO_2$ 52.3 and 0.7 of $Ta_2O_5$. Yet another glass which has physical properties compatible with silicon and a coefficient of expansion of about $58\times10^{-7}$ and an application temperature in the range of 545–555° C. consists essentially of in mol percent PbO 27.8, $Al_2O_3$ 4.2, $B_2O_3$ 15.0, $SiO_2$ 52.3 and 0.7 of $TiO_2$.

*Preparation of new glass compositions*

The starting materials in powdered form comprising PbO, $Al_2O_3$, $B_2O_3$ and $SiO_2$ together with the selected additive are weighed in the proper amounts, combined and then dry mixed in a blender for about 20 minutes. Then they are fired for about an hour at 1300–1400° C. in a covered platinum crucible in a resistance furnace. During the firing, the materials are stirred with a platinum rod. Then the materials are fined, that is allowed to sit for about one half hour to release all bubbles from the molten material. Thereafter the batch of material is water cracked, the batch being poured into agitated water which cracks the glass into small pieces. Next the glass is ground in a ball mill to a mean particle size of approximately 0.1–0.7 micron, about 0.1 being a desirable size.

Figure 2A:
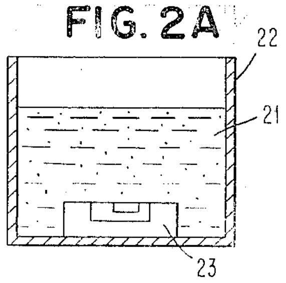
FIGS. 2A–2C are drawings representing steps in a procedure which may be employed in applying colloidal particles directly to a surface of a semiconductor device.
Figure 2B:
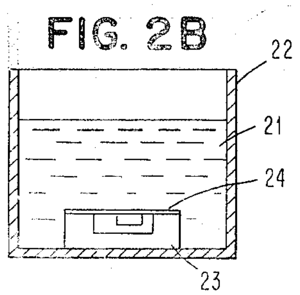
Figure 2C:
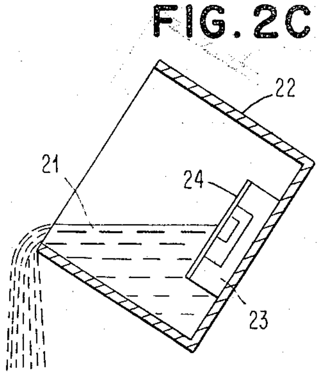

The powdered glass is suspended in a fluid having a suitable dielectric constant such as one of those described above in connection with FIGS. 1A and 1B, a mixture of 10 parts of isopropyl alcohol and 90 parts of ethyl acetone being appropiate. A colloidal solution of these materials is formed by a centrifuging operation. Then, as represented in FIG. 2A, some of this solution 21 is placed in another centrifuging container 22 along with a semiconductor device 23 which, it will be assumed, is to have its exposed junctions on its upper surface passivated and protected only by a glass layer applied thereto. Device 23 is similar to the one represented in FIG. 1A but does not have oxide and glass layers formed thereon. The container 22 and its contents are placed in a centrifuging machine and a centrifugal force of about 1000–2500 times the force of gravity is applied for about 1–2 minutes. This deposits a thin uniformly smooth layer 24 of comminuted glass particles on the upper surface of the semiconductor device 23 as presented in FIG. 2B. The thickness of the layer or deposited film may be controlled by the concentration and the height of the colloidal solution 21 over the upper surface of the semiconductor device 23. The liquid in the container 22 is then decanted as represented in FIG. 2B, leaving the thin layer 24 of sedimented glass particles which constitutes a compact uniform powdered film as represented in the enlarged sectional view of FIG. 3.

The semiconductor device 23 is removed from the container and fired in a tube furnace for about 5–10 minutes at a temperature which is termed the application temperature of the glass. This temperature is near the softening temperature of the glass particles and may be about 10–15 degrees centigrade below the softening point of the glass. For the glasses under consideration, this temperature is below 570° C. and usually is in the range of about 540–555° C. The firing operation fuses the colloidal glass particles of FIG. 3 and forms a continuous, hole-free layer of glass having a uniform thickness on the upper surface of the semiconductor device. This layer is similar to the layer 25 represented in FIG. 4 except that it does not include the apertures 26, 27 and 28 therein and the emitter, base and collector terminals 29, 30 and 31 which are subsequently formed in layer 25 by conventional etching and evaporation operations in the manner previously explained in connection with FIG. 1B. A suitable thickness for the layer 25 is in the range of 0.4–50 microns.

While the glass compositions of the present invention have been considered in relation to glass layers applied to silicon semiconductor devices, it will be understood that they may be employed to protect devices using other semiconductor materials. Also, while these glasses have been considered in connection with the fabrication of a single semiconductor device, it will be appreciated that ordinarily an array of several hundred such devices are fabricated and glassed simultaneously. Thereafter the array is severed into individual devices by ultrasonic or other cutting means.

While the invention has been particularly shown and described with reference to preferred embodiments thereof, it will be understood by those skilled in the art that various changes in form and details may be made therein without departing from the spirit and scope of the invention.

What is claimed is:

1. An encapsulated silicon semiconductor device comprising a silicon semiconductor member having at least one PN junction therein; at least one aluminum ohmic contact; and a layer of glass encapsulating a surface of said semiconductor member having an application temperature below 570° C., said glass consisting essentially of in mol percent:

| | |
|---|---|
| Lead oxide (PbO) | 23–50 |
| Aluminum trioxide ($Al_2O_3$) | 0–19 |
| Boron trioxide ($B_2O_3$) | 6–18 |
| Silicon dioxide ($SiO_2$) | 33–65 |

and 0.1 to 1.0 mol percent of an oxide from the group consisting of niobium pentoxide ($Nb_2O_5$), zirconium dioxide ($ZrO_2$), titanium dioxide ($TiO_2$), and tantalum pentoxide ($Ta_2O_5$).

2. An encapsulated silicon semiconductor device comprising a silicon semiconductor member having at least one PN junction therein; at least one aluminum ohmic contact; and a layer of glass encapsulating a surface of said semiconductor member and capable of being applied directly thereto without an intervening buffer layer at an application temperature below 570° C., said glass consisting essentially of in mol percent:

| | |
|---|---|
| Lead oxide (PbO) | 23–50 |
| Aluminum trioxide ($Al_2O_3$) | 0–19 |
| Boron trioxide ($B_2O_3$) | 6–18 |
| Silicon dioxide ($SiO_2$) | 33–65 |

and 0.1 to 1.0 mol percent of an oxide from the group consisting of niobium pentoxide ($Nb_2O_5$), zirconium dioxide ($ZrO_2$), titanium dioxide ($TiO_2$), and tantalum pentoxide ($Ta_2O_5$).

3. An encapsulated silicon semiconductor device comprising a silicon semiconductor member having at least one PN junction therein; at least one aluminum ohmic contact; and a layer of glass encapsulating a surface of said semiconductor member having an application temperature in the range of about 540–548° C., said glass consisting essentially of in mol percent:

| | |
|---|---|
| Lead oxide (PbO) | 31.7 |
| Aluminum trioxide ($Al_2O_3$) | 3.5 |
| Boron trioxide ($B_2O_3$) | 12.0 |
| Silicon dioxide ($SiO_2$) | 52.8 |

and 0.7 mol percent of niobium pentoxide ($Nb_2O_5$).

4. An encapsulated silicon semiconductor device comprising a silicon semiconductor member having at least one PN junction therein; at least one aluminum ohmic contact; and a layer of glass encapsulating a surface of said semiconductor member and having an application temperature below 570° C., said glass comprising the materials of the quaternary system $PbO-Al_2O_3-B_2O_3-SiO_2$ encompassed within the volume in the compositional tetrahedron of those four materials defined by straight lines joining the following compositional points expressed in mol percent:

| Points | PbO | $Al_2O_3$ | $B_2O_3$ | $SiO_2$ |
|---|---|---|---|---|
| 1 | 38.5 | 0 | 6 | 55.5 |
| 2 | 32.9 | 0 | 6 | 61.1 |
| 3 | 40.4 | 16.0 | 6 | 37.6 |
| 4 | 46.1 | 10.3 | 6 | 37.6 |
| 5 | 33.6 | 0 | 18 | 48.4 |
| 6 | 23.0 | 0 | 18 | 59.0 |
| 7 | 32 0 | 17.2 | 18 | 32.8 |
| 8 | 39.7 | 9.8 | 18 | 32.8 |

and 0.1–1.0 mol percent of an oxide from the group consisting of $Nb_2O_5$, $ZrO_2$, $TiO_2$ and $Ta_2O_5$.

References Cited by the Examiner

UNITED STATES PATENTS

| | | | |
|---|---|---|---|
| 2,393,448 | 1/1946 | Armistead | 106—53 |
| 2,417,898 | 3/1947 | Armistead | 106—53 |
| 2,882,187 | 4/1959 | Kwate | 106—49 |
| 2,906,907 | 9/1959 | Peras | 106—49 |
| 2,920,971 | 1/1960 | Stookey | 65—33 |
| 3,060,041 | 10/1962 | Loewenstein | 106—50 |
| 3,149,984 | 9/1964 | Faulstich | 106—53 |
| 3,170,813 | 2/1965 | Duncan et al. | 117—93.1 X |
| 3,200,310 | 8/1965 | Carman | 317—234 |
| 3,247,428 | 4/1966 | Perri et al. | 317—234 |

OTHER REFERENCES

Journal of The American Ceramic Society, Dalton, vol. 39, No. 3, March 1956, relied on pages 109–112.

DAVID L. RECK, *Primary Examiner.*

HYLAND BIZOT, *Examiner.*

C. N. LOVELL, *Assistant Examiner.*